(12) United States Patent
Naaman et al.

(10) Patent No.: US 9,013,916 B2
(45) Date of Patent: Apr. 21, 2015

(54) JOSEPHSON MAGNETIC MEMORY CELL SYSTEM

(75) Inventors: Ofer Naaman, Ellicott City, MD (US);
Donald L. Miller, Export, PA (US);
Anna Y. Herr, Ellicott City, MD (US);
Norman O. Birge, East Lansing, MI (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 511 days.

(21) Appl. No.: 13/485,397

(22) Filed: May 31, 2012

(65) Prior Publication Data

US 2015/0043273 A1    Feb. 12, 2015

(51) Int. Cl.
*G11C 11/44*    (2006.01)
*G11C 11/16*    (2006.01)

(52) U.S. Cl.
CPC ............ *G11C 11/44* (2013.01); *G11C 11/1675* (2013.01); *G11C 11/1673* (2013.01)

(58) Field of Classification Search
USPC .................................. 365/162, 171, 173, 158
See application file for complete search history.

(56) References Cited

U.S. PATENT DOCUMENTS

| 4,601,015 | A | 7/1986 | Ishida |
| 5,276,639 | A | 1/1994 | Inoue |
| 5,942,765 | A | 8/1999 | Miyahara et al. |
| 7,535,069 | B2 | 5/2009 | Abraham et al. |
| 8,208,288 | B2 * | 6/2012 | Bulzacchelli et al. ........ 365/158 |
| 2009/0244958 | A1 | 10/2009 | Bulzacchelli et al. |
| 2011/0267878 | A1 | 11/2011 | Herr et al. |
| 2012/0120719 | A1 | 5/2012 | Worledge |

OTHER PUBLICATIONS

Bell, et al.: "*Controllable Josephson Current Through a Pseudospin-Valve Structure*"; Applied Physics Letters 84, 1153-1156, 2004.
Eschrig: "*Spin-polarized Supercurrents for Spintronics*"; Physics Today, Jan. 2011, 43-49.
Khaire, et al.: "*Observation of Spin-Triplet Superconductivity in Co-Based Josephson Junctions*"; Phys. Ref. Lett 104, 137002 (2010).
Robinson, et al.: "*Controlled Injection of Spin-Triplet Supercurrents into a Strong Ferromagnet*"; Science, 329, 59 (2010).
Slaughter: "*Materials for Magnetoresistive Random Access Memory*"; Annu. Rev. Mater. Res. 2009.39, 277 (2009).
Volkov, et al.: "*Odd Spin-Triplet Superconductivity in a Multilayered Superconductor-Ferromagnet Josephson Junction*"; Phys. Rev. B81, 144522 (2010).

(Continued)

*Primary Examiner* — David Lam
(74) *Attorney, Agent, or Firm* — Tarolli, Sundheim, Covell & Tummino LLP (57) ABSTRACT

One aspect of the present invention includes a Josephson magnetic memory system. The system includes a superconducting electrode that conducts a read current. The system also includes a hysteretic magnetic Josephson junction (HMJJ). The HMJJ can store a binary value and convert superconducting pairs associated with the read current flowing through the HMJJ from a singlet-state to a triplet-state. The system further includes a write circuit magnetically coupled to the HMJJ and configured to write the binary value into the at HMJJ in response to at least one write current and a read circuit configured to determine the binary value stored in the HMJJ in response to application of the read current to the HMJJ.

20 Claims, 4 Drawing Sheets

(56) References Cited

OTHER PUBLICATIONS

Keizer, et al.: "*A Spin Triplet Supercurrent Through the Half-Metallic Ferromagnet $CrO_2$*", Nature Publishing Group 2006, Retrieved from ProQuest: <URL: http://search.proquest.com/docview/204549152/14092A830B16537D65/1?accountid=142944>, pp. 825-827.

International Search Report for corresponding PCT/US2013/040950, mailed Oct. 1, 2013, completed by Blaine R. Copenheaver.

\* cited by examiner

JOSEPHSON MAGNETIC MEMORY CELL SYSTEM

TECHNICAL FIELD

The present invention relates generally to quantum and classical digital superconducting circuits, and specifically to a Josephson magnetic memory cell system.

BACKGROUND

Superconducting digital technology has provided computing and/or communications resources that benefit from unprecedented high speed, low power dissipation, and low operating temperature. For decades, superconducting digital technology has lacked random-access memory (RAM) with adequate capacity and speed relative to logic circuits. This has been a major obstacle to industrialization for current applications of superconducting technology in telecommunications and signal intelligence, and can be especially forbidding for high-end computing. All concepts currently considered for superconducting memory have been based on quantization of magnetic flux quanta in a superconducting inductive loop. Such memories can be readily adapted to high speed register files given a foundry process with adequate yield, but can never achieve the integration density of complementary metal-oxide semiconductor (CMOS), as they are fundamentally limited by the size of the inductive loop.

SUMMARY

One aspect of the present invention includes a Josephson magnetic memory cell system. The system includes at least one superconducting electrode configured to conduct a read current. The system also includes at least one hysteretic magnetic Josephson junction (HMJJ). At least one of the at least one HMJJ is configured to store a binary value and to convert superconducting pairs associated with the read current flowing through the at least one of the at least one HMJJ from a singlet-state to a triplet-state. The system further includes a write circuit magnetically coupled to at least one of the at least one HMJJ and configured to write the binary value into the at least one of the at least one HMJJ in response to at least one write current and a read circuit configured to determine the binary value stored in the at least one of the at least one HMJJ in response to application of the read current to the at least one of the at least one HMJJ.

Another aspect of the present invention includes a Josephson magnetic memory cell system. The system includes at least one superconducting electrode configured to conduct a read current. The system also includes an HMJJ comprising at least one first magnetic material layer having a fixed magnetization and at least one second magnetic material layer having a free magnetization corresponding to a bi-stable orientation. At least one of the at least one first magnetic material layer and the at least one second magnetic material layer has a substantially orthogonal magnetic polarity with respect to remaining magnetic material layers. The HMJJ is configured to store a binary value based on the magnetic polarity of at least one of the at least one first and the at least one second magnetic material layers. The system further includes a write circuit magnetically coupled to the HMJJ and configured to write the binary value into the HMJJ in response to at least one write current and a read circuit configured to determine the binary value stored in the HMJJ in response to application of the read current to the HMJJ.

Another aspect of the present invention includes a Josephson magnetic random access memory (JMRAM) comprising a plurality of Josephson magnetic memory cell systems arranged as an array of rows and columns. Each of the Josephson magnetic memory cell systems includes an HMJJ comprising at least one first magnetic material layer having a fixed magnetization and at least one second magnetic material layer having a free magnetization corresponding to a bi-stable orientation. At least one of the at least one first magnetic material layer and at least one second magnetic material layer has a substantially orthogonal magnetic polarity with respect to remaining magnetic material layers to convert superconducting pairs associated with the read current flowing through the HMJJ from a singlet-state to a triplet-state in the respective HMJJ. Each of the HMJJs are configured to store a respective binary value in response to a word-write current that is provided on a word-write line and a bit-write current that is provided on a bit-write line to adjust the magnetic polarity of at least one of the at least one second magnetic material layer. Each of the HMJJs are further configured to output the respective binary value in response to a word-read current that is provided on a word-read line and a bit-read current that is provided on a bit-read line.

DETAILED DESCRIPTION

The present invention relates generally to quantum and classical digital superconducting circuits, and specifically to a Josephson magnetic memory cell system. A Josephson magnetic memory cell system can include a hysteretic magnetic Josephson junction (HMJJ) that includes at least one fixed magnetic material layer and at least one free magnetic material layer having a bi-stable orientation. At least one of the fixed and free magnetic material layers can include a magnetic polarity that is substantially orthogonal to the magnetic polarity of the remaining layers. The Josephson magnetic memory cell system can be implemented to store a binary value based on manipulating the magnetic polarity of the at least one free magnetic material layers. The Josephson magnetic memory cell system can also include a Josephson junction arranged in parallel with the HMJJ. Therefore, the Josephson junction and the HMJJ are cooperatively arranged as a superconducting quantum interference device (SQUID) that can provide an indication of the binary value stored in the HMJJ based on a magnetic flux between the Josephson junction and the HMJJ in response to a read current, such as during a read operation.

As a result of the substantially orthogonal magnetic polarization of at least one of the magnetic layers relative to the remaining magnetic layers, superconducting Cooper pairs associated with the read current that flows through the HMJJ can be converted from a singlet-state to a triplet-state during the read operation. As a result of implementation of a triplet-state current for readout of the HMJJ, superconducting correlations in the Josephson magnetic memory cell system can allow for a larger read current, and can provide substantially greater distinction between logic-states stored in the HMJJ. In addition, triplet-state superconducting Cooper pairs associated with the read current can be substantially less sensitive with respect to a thickness of the magnetic layers of the HMJJ. Accordingly, small variations in thickness of the magnetic material layers associated with the Josephson magnetic memory cell system due to fabrication tolerances can be substantially irrelevant with respect to operation of the Josephson magnetic memory cell system.

Figure 1:
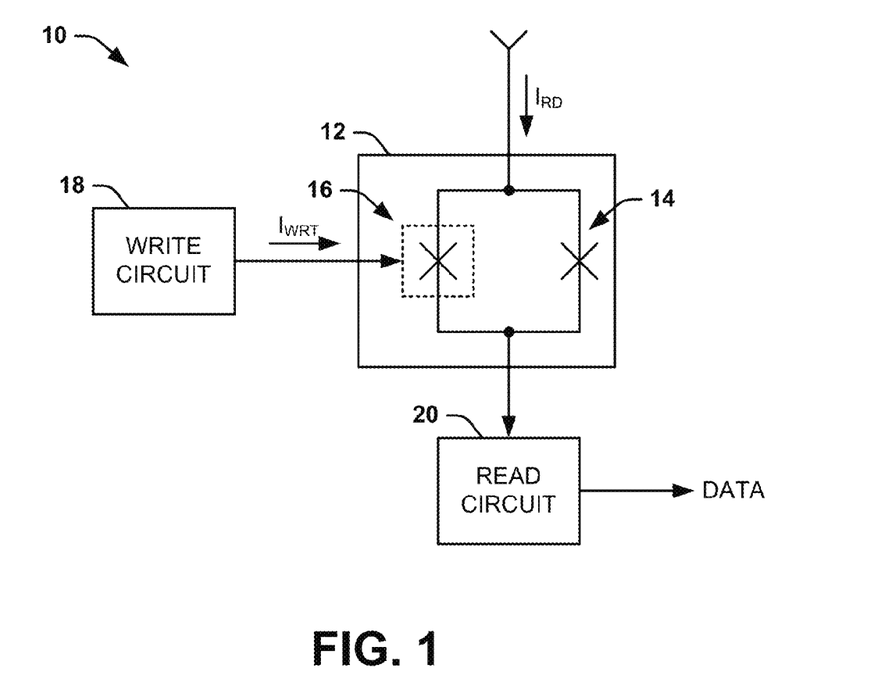
FIG. 1 illustrates an example of a Josephson magnetic memory cell system in accordance with an aspect of the invention.

FIG. 1 illustrates an example of a Josephson magnetic memory cell system 10 in accordance with an aspect of the invention. The Josephson magnetic memory cell system 10 includes a memory cell 12 that can correspond to a single memory cell, such as can be included in a memory array of a random access memory (RAM). The memory cell 12 includes a Josephson junction 14 and a hysteretic magnetic Josephson junction (HMJJ) 16 arranged in parallel, such that the Josephson junction 14 and the HMJJ 16 are cooperatively arranged as a superconducting quantum interference device (SQUID). It is to be understood that the Josephson junction 14 may also be configured as an HMJJ, and may either be in a static state or may participate together with HMJJ 16 in the storage of a binary value, as described herein.

As an example, the HMJJ 16 can include at least one fixed magnetic material layer and at least one free magnetic material layer having a bi-stable orientation. At least one of the fixed and free magnetic material layers of the HMJJ 16 can include a magnetic polarity that is substantially orthogonal to the magnetic polarity of the remaining layers. As described in greater detail herein, the substantially orthogonal magnetic polarity can be configured to convert superconducting Cooper pairs associated with a read current $I_{RD}$ from a singlet-state to a triplet-state during a read operation. As a result, the logic-state stored in the HMJJ 16 can be better distinguished during the read operation, and the HMJJ 16 can be substantially insensitive to manufacturing tolerances.

For example, the HMJJ 16 can be configured to store a binary value (e.g., a logic1 or a logic-0) based on a magnetic polarization of at least one of the free magnetic material layers. In the example of FIG. 1, the Josephson magnetic memory cell system 10 includes a write circuit 18 configured to generate at least one write current $I_{WRT}$ on a write-line that is magnetically coupled to the HMJJ 16. The write current(s) $I_{WRT}$ can generate a magnetic field to set the binary value of the HMJJ 16 to a binary logic-1 or a binary logic-0 based on respective directions of current flow during a data write operation. As an example, the write circuit 18 can be part of a peripheral write circuit for an entire array of memory cells that includes the Josephson magnetic memory cell system 10.

The binary value that is stored in the HMJJ 16 can be read from the Josephson magnetic memory cell system 10 during a read operation in response to a read current $I_{RD}$. As an example, the read current $I_{RD}$ can correspond to a bit read current that is applied to an entire column of memory cells in the array, or can be individually generated for the Josephson magnetic memory cell system 10. The read current $I_{RD}$ is provided to Josephson junction 14 and the HMJJ 16 at a magnitude that corresponds to the respective critical currents of the Josephson junction 14 and the HMJJ 16. For example, the Josephson junction 14 can have a critical current ($I_{C2}$) that is static and the HMJJ 16 can have a critical current ($I_{C1}$) that varies based on the orientation of the magnetic polarity of the at least one free magnetic material layer, and thus based on the binary value that is stored therein. For example, the HMJJ 16 can be configured to have a critical current having a given magnitude when storing a logic-0 as the binary value and can have a critical current of approximately the same magnitude but opposite direction when storing a logic-1. The HMJJ 16 can thus be configured as a "0-junction" when storing a first logic-state as the binary value and as a "pi-junction" when storing the second logic-state as the binary value. Therefore, in response to the read current $I_{RD}$, the Josephson junction 14 and the HMJJ 16 can trigger a voltage pulse based on their respective critical currents which can result in a total critical current of the memory cell 12 that is approximately equal to $I_{C2}+I_{C1}$ when storing a first state of the binary value and approximately equal to $I_{C2}-I_{C1}$ when storing a second state of the binary value. The difference in the response of the HMJJ 16 between the first and second logic-states of the stored binary value can result in variation of the magnetic flux between the Josephson junction 14 and the HMJJ 16. Accordingly, the magnetic flux between the Josephson junction 14 and the HMJJ 16 can be indicative of the binary value stored in the HMJJ 16.

In the example of FIG. 1, the Josephson magnetic memory cell system 10 includes a read circuit 20. The read circuit 20 is configured to determine the binary value that is stored in the HMJJ 16 in response to the read current $I_{RD}$, demonstrated in the example of FIG. 1 as a signal DATA corresponding to the stored binary value. The read circuit 20 can determine the binary value in any of a variety of ways, such as based on sensing current magnitude, voltage pulses, or the magnetic flux between the Josephson junction 14 and the HMJJ 16. For example, the read circuit 20 can be configured to generate a peripheral current through an inductor (not shown) that is magnetically coupled to the memory cell 12, such that the magnitude of the peripheral current changes based on the magnetic flux between the Josephson junction 14 and the HMJJ 16, thus indicating the binary value stored in the HMJJ 16. Thus, while it is demonstrated in the example of FIG. 1 that the read circuit 20 is conductively coupled to the memory cell 12, it is to be understood that the read circuit 20 can instead be coupled to the memory cell 12 in a variety of different ways.

As described previously, the HMJJ 16 includes at least one fixed magnetic material layer and at least one free magnetic material layer having a bi-stable orientation, and that at least one of the fixed and free magnetic material layers of the HMJJ 16 can include a magnetic polarity that is substantially orthogonal to the magnetic polarity of the remaining layers. The arrangement of the HMJJ 16 can be formed in a variety of different ways.

Figure 2:
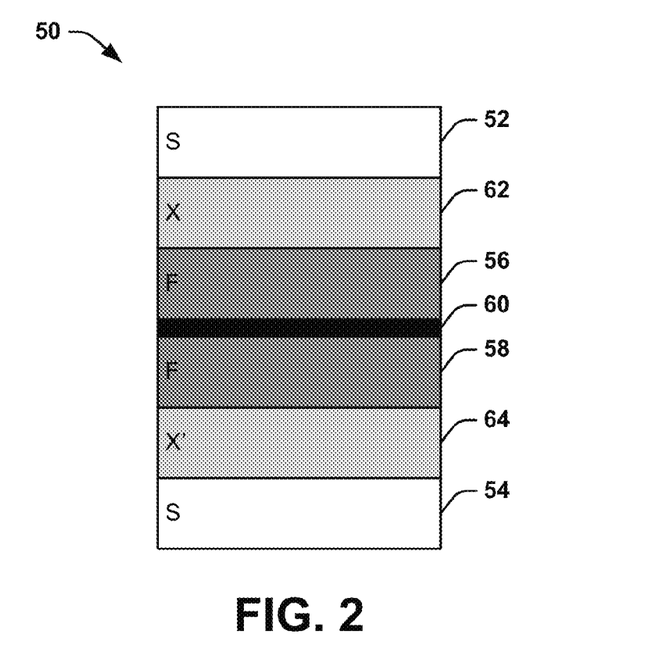
FIG. 2 illustrates an example of a hysteretic magnetic Josephson junction (HMJJ) in accordance with an aspect of the invention.

FIG. 2 illustrates an example of an HMJJ 50 in accordance with an aspect of the invention. The HMJJ 50 can correspond to the HMJJ 16 in the example of FIG. 1. Therefore, reference is to be made to the example of FIG. 1 in the following description of the example of FIG. 2. The HMJJ 50 includes a first superconducting electrode layer 52 and a second superconducting electrode 54, demonstrated in the example of FIG. 2 as "S". For example, the first and second superconducting electrode layers 52 and 54 can be formed from a variety of superconducting materials, such as Niobium (Nb).

The first and second superconducting electrode layers 52 and 54 can be directly coupled to an associated bit-read line on which the read current $I_{RD}$ flows, such that the bit-read lines can likewise be formed from the superconducting material. The HMJJ 50 also includes a first magnetic layer 56 and a second magnetic layer 58, demonstrated in the example of FIG. 2 as "F", that are separated by a tunnel barrier layer 60. The first and second magnetic layers 56 and 58 can be fixed magnetic layers, such that they have a substantially fixed magnetic polarity that can be anti-parallel with respect to each other. As an example, the first and second magnetic layers 56 and 58 can be formed from a ferromagnetic material, such as cobalt (Co) or iron (Fe), or a synthetic antiferromagnetic (SAF) material. The tunnel barrier 60 is configured to provide a desired magnitude of the Josephson critical current through the HMJJ 50.

The HMJJ 50 further includes a first polarizing layer 62 that interconnects the first superconducting electrode layer 52 and the first magnetic layer 56, and a second polarizing layer 64 that interconnects the second superconducting electrode layer 54 and the second magnetic layer 58. In the example of FIG. 2, the first and second polarizing layers 62 and 64 are demonstrated as "X" and "X'", respectively. The first and second polarizing layers 62 and 64 can be formed from a ferromagnetic material or alloy, such as nickel (Ni), Permalloy, palladium-nickel (PdNi), copper-nickel (CuNi), cobalt-platinum (CoPt), or any of a variety of other materials. At least one of the first and second polarizing layers 62 and 64 can have a magnetic polarity that is substantially orthogonal with respect to the magnetic polarity associated with the first and second magnetic layers 56 and 58. In the example of FIG. 2, the first polarizing layer (i.e., X) is a fixed magnetic material layer, but the second polarizing layer 64 (i.e., X') can be a free magnetic material layer, such that the free magnetic material layer has a bi-stable orientation that permits a variable magnetic polarity therein. Therefore, the magnetic polarity of the free magnetic material layer can be set as a result of magnetic fields generated locally by orthogonal electrical currents, such as the at least one write current $I_{WRT}$. Such magnetic polarity can affect the magnitude and/or sign of the critical current of the HMJJ 50, as described previously. Accordingly, the binary value can be stored in the HMJJ 50 based on the magnetic polarity of the free magnetic material of one of the first and second polarizing layers 62 and 64.

As a result of the substantially orthogonal magnetic polarity of at least one of the first and second polarizing layers 62 and 64, the angular momentum of superconducting Cooper pairs of a tunneling current flowing through the HMJJ 50 (e.g., the read current $I_{RD}$) can be manipulated to convert the superconducting Cooper pairs from a singlet-state (spin-up/spin-down) to a triplet-state (spin-up/spin-up or spin-down/spin-down). The conversion of the superconducting pairs from the singlet-state to the triplet-state can be achieved with maximum effect based on both of the first and second polarizing layers 62 and 64 having a substantially orthogonal magnetic polarity relative to the magnetic polarity of the first and second magnetic layers 56 and 58.

As a result of the conversion of the superconducting pairs from the singlet-state to the triplet-state, the HMJJ 50 can exhibit a number of advantages over typical superconductor-based memory cells, such as those that implement singlet-state tunneling currents for readout. For example, the triplet-state tunneling current (e.g., the read current $I_{RD}$) flowing through the HMJJ 50 can have a substantially greater magnitude than a singlet-state tunneling current, particularly when the thickness of the magnetic layers 56 and 58 is greater than a few nanometers. Therefore, the readout of the binary value can be substantially improved based on improved readout contrast between the logic-states of the binary value stored in the HMJJ 50, and the thickness of the magnetic layers 56, 58, 62, and 64 can be greater than typical superconductor-based memory cells. As another example, the magnitude of the triplet-state current can be substantially insensitive to small variations in the thickness of the magnetic layers 56, 58, 62, and 64. Therefore, variations of the thicknesses of the magnetic layers 56, 58, 62, and 64 due to fabrication tolerances during manufacture of the Josephson magnetic memory cell system 10 can be substantially irrelevant to the readout of the HMJJ 50. As another example, the spin-up/spin-up or spin-down/spin-down electron-pair orientation of the triplet-state can result in the triplet-state tunneling current being substantially sensitive to majority/minority band effects that can give rise to tunneling magnetoresistance (TMR) effect, which is substantially absent for singlet-state tunneling current that contains equal numbers of spin-up and spin-down electrons and which substantially concurrently samples both majority and minority bands. Accordingly, the HMJJ 50 can be configured as a "toggle-MRAM" having significantly enhanced write margins.

Figure 3:
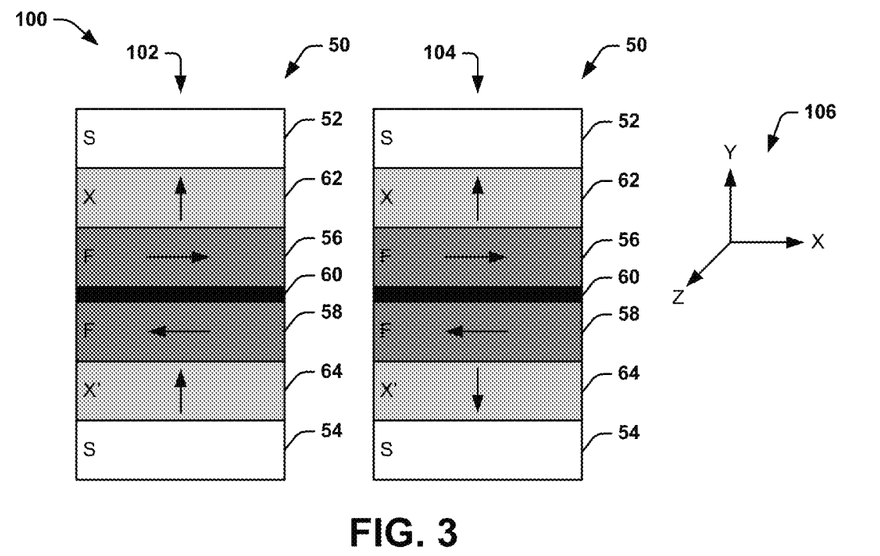
FIG. 3 illustrates an example of a diagram of two states of an HMJJ in accordance with an aspect of the invention.

FIG. 3 illustrates an example of a diagram 100 of two states of the HMJJ 50 in accordance with an aspect of the invention. The diagram 100 includes a first state 102 corresponding to a first logic-state of the binary value stored in the HMJJ 50 and a second state 104 corresponding to a second logic-state of the binary value stored in the HMJJ 50. It is to be understood that the specific logic-states associated with the first and second states 102 and 104 can be arbitrary depending on the associated readout system. The diagram 100 demonstrates magnetic polarities in the magnetic layers 56, 58, 62, and 64 based on a Cartesian coordinate system 106.

In the first state 102, the first magnetic layer 56 has a first magnetic polarity in the +X direction and the second magnetic layer 58 has a second magnetic polarity in the −X direction, and which is thus substantially anti-parallel with respect to the first magnetic polarity. In addition, the first polarizing layer 62 and the second polarizing layer 64 have magnetic polarities in the +Y direction, and which are thus parallel with respect to each other and substantially orthogonal to the first and second magnetic polarities. It is to be understood that, while the magnetic polarities of the first and second polarizing layers 62 and 64 are demonstrated in the +Y direction, it is to be understood that the polarities of the first and second polarizing layers 62 and 64 could instead both be in the −Y direction, the +Z direction, or the −Z direction, such that they are substantially orthogonal to the first and second magnetic polarities. As described previously, the first polarizing layer 62 is a fixed magnetic material, such that the magnetic polarity is static. However, the second polarizing layer 64 can be a free magnetic material layer, such that the magnetic polarity of the second polarizing layer 64 can be set to the orientation in the first state 102 based on at least one write current (e.g., the write current $I_{WRT}$).

In the second state 104, the magnetic polarities of the first and second magnetic layers 56 and 58 and the first polarizing layer 62 remain the same as in the first state 102, based on the first and second magnetic layers 56 and 58 and the first polarizing layer 62 being formed as fixed magnet material layers. However, in the second state 104, the second polarizing layer 64 has a magnetic polarity in the −Y direction, which is thus anti-parallel with respect to the magnetic polarity of the first polarizing layer 62 and remains substantially orthogonal to the first and second magnetic polarities. Therefore, in the second state 104, the magnetic polarity of the second polarizing layer 64 is set to the opposite orientation as that in the first state 102 based on at least one write current (e.g., the write current $I_{WRT}$) to change the sign of the critical current of the HMJJ 50. Accordingly, the magnetic polarity of the second polarizing layer 64 can dictate the binary value that is stored in the HMJJ 50.

Figure 4:
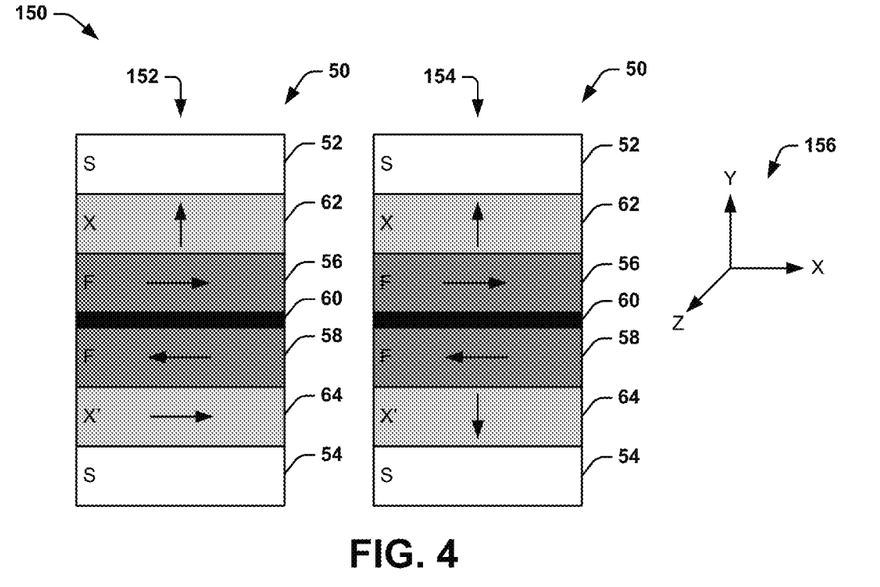
FIG. 4 illustrates another example of a diagram of two states of an HMJJ in accordance with an aspect of the invention.

FIG. 4 illustrates another example of a diagram 150 of two states of the HMJJ 50 in accordance with an aspect of the invention. The diagram 150 includes a first state 152 corresponding to a first logic-state of the binary value stored in the HMJJ 50 and a second state 154 corresponding to a second logic-state of the binary value stored in the HMJJ 50. Similar to as described previously in the example of FIG. 2, it is to be understood that the specific logic-states associated with the first and second states 152 and 154 can be arbitrary depending on the associated readout system. The diagram 150 demonstrates magnetic polarities in the magnetic layers 56, 58, 62, and 64 based on a Cartesian coordinate system 156.

In the first state 152, the first magnetic layer 56 has a first magnetic polarity in the +X direction and the second magnetic layer 58 has a second magnetic polarity in the −X direction, and which is thus substantially anti-parallel with respect to the first magnetic polarity. In addition, the first polarizing layer 62 has a magnetic polarity in the +Y direction which is thus substantially orthogonal to the first and second magnetic polarities, and the second polarizing layer 64 has a magnetic polarity in the +X direction, which is substantially parallel with the first magnetic polarity. As described previously, the first polarizing layer 62 is a fixed magnetic material, such that the magnetic polarity is static. However, the second polarizing layer 64 can be a free magnetic material layer, such that the magnetic polarity of the second polarizing layer 64 can be set to the orientation in the first state 152 based on at least one write current (e.g., the write current $I_{WRT}$).

In the second state 154, the magnetic polarities of the first and second magnetic layers 56 and 58 and the first polarizing layer 62 remain the same based on the first and second magnetic layers 56 and 58 and the first polarizing layer 62 being formed as fixed magnet material layers. However, in the second state 154, the second polarizing layer 64 has a magnetic polarity in the −Y direction, which is thus anti-parallel with respect to the magnetic polarity of the first polarizing layer 62 and is substantially orthogonal to the first and second magnetic polarities. Therefore, in the second state 154, the magnetic polarity of the second polarizing layer 64 is rotated substantially 90° relative to the first state 152 based on at least one write current (e.g., the write current $I_{WRT}$).

For example, the second polarizing layer 64 can be formed from a magnetic material having a bi-axial anisotropy, such that the magnetic polarity can be set orthogonally on easy axes with respect to the first and second states 152 and 154. For example, the magnetic polarities of the second polarizing layer 64 in each of the first and second states 152 and 154 can be set based on a relative magnitude of two write currents $I_{WRT}$ to adjust a magnetic polarity vector in the second polarizing layer 64. As described previously, the conversion of the superconducting pairs from the singlet-state to the triplet-state can be achieved with maximum effect based on both of the first and second polarizing layers 62 and 64 having a substantially orthogonal magnetic polarity relative to the magnetic polarity of the first and second magnetic layers 56 and 58. Therefore, in the first state 152, the HMJJ 50 can exhibit substantially diminished conversion of the superconducting pairs to the triplet-state. As a result, the HMJJ 50 in the example of FIG. 4 can be fabricated in a manner that the thickness of the magnetic layers 56 and 58 can be sufficient to substantially prevent a predominantly singlet-state tunneling current from flowing through the HMJJ 50 in the first state 152. In the second state 154, with both of the first and second polarizing layers 62 and 64 being substantially orthogonal to the first and second magnetic polarities, and thus having maximum conversion of the superconducting pairs to the triplet-state, the predominantly triplet-state tunneling current can flow through HMJJ 50. Accordingly, the binary value that is stored in the HMJJ 50 in the example of FIG. 4 can be read from the HMJJ 50 based on whether the tunneling current (i.e., the read current $I_{RD}$) flows through the HMJJ 50.

It is to be understood that the HMJJ 50 is not intended to be limited to the example of FIGS. 2-4. For example, the layers of the HMJJ 50 need not be formed in the specific order and orientation demonstrated in the example of FIG. 2. For example, the location of the tunnel barrier 60 relative to the magnetic layers 56, 58, 62, and 64 can be substantially interchangeable. Additionally, while the magnetic layers 56, 58, 62, and 64 and the superconducting electrode layers 52 and 54 are demonstrated as having substantially equal thickness, the thicknesses of the layers can vary relative to each other. In addition, the magnetic layers 56, 58, 62, and 64 may be formed with different magnetic materials. Also, the orientations of the magnetic polarities are not limited to the specific orientations provided in the examples of FIGS. 2-4, but could instead have corresponding anti-parallel or orthogonal magnetic polarities, as described previously. As a further example, the magnetic layers 56 and 58 in FIGS. 2-4 may be replaced with a single magnetic layer having a single fixed magnetic polarity, such that the tunnel barrier 60 is arranged directly above or below the single magnetic layer. For example, in FIG. 2, the magnetic layers 56 and 58 can be replaced with a single magnetic layer having perpendicular magnetic anisotropy with its magnetic polarity being fixed in approximately the +Y direction, whereas the magnetic polarities of the respective fixed and free polarizing layers 62 and 64 can be oriented in the X- or Z-axes. Furthermore, as described in the example of FIG. 5, an HMJJ could include additional magnetic layers.

Figure 5:
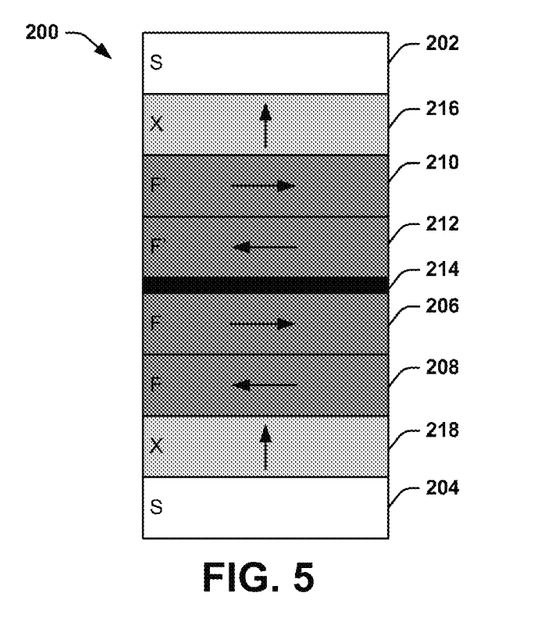
FIG. 5 illustrates another example of a HMJJ in accordance with an aspect of the invention

FIG. 5 illustrates an example of an HMJJ 200 in accordance with an aspect of the invention. The HMJJ 200 can likewise correspond to the HMJJ 16 in the example of FIG. 1. Therefore, reference is to be made to the example of FIG. 1 in the following description of the example of FIG. 5. The HMJJ 200 includes a first superconducting electrode layer 202 and a second superconducting electrode 204, demonstrated in the example of FIG. 5 as "S". The HMJJ 200 also includes a first magnetic layer 206 and a second magnetic layer 208, demonstrated in the example of FIG. 5 as "F". The first and second magnetic layers 206 and 208 can be configured as SAF layers having a fixed magnetization, such that they have a substantially fixed magnetic polarity that can be anti-parallel with respect to each other. The HMJJ 200 also includes a third magnetic layer 210 and a fourth magnetic layer 212, demonstrated in the example of FIG. 5 as "F" that are similarly as SAF layers such that their magnetization is substantially anti-parallel with respect to each other. As an example, while the magnetic layers 206 and 208 and the layers 210 and 212 are demonstrated in an SAF configuration, it is to be understood that at least one of the pairs of magnetic layers 206 and 208 and magnetic layers 210 and 212 can be alternatively replaced with a single ferromagnetic layer. The first magnetic layer 206 and the fourth magnetic layer 212 are separated by a tunnel barrier 214.

The third and fourth magnetic layers 210 and 212 can be configured as a free SAF, such that the magnetization of the third and fourth magnetic layers 210 and 212 is anti-parallel with respect to each other along an axis that has a bi-stable orientation, such as to permit a variable magnetic polarity therein. Therefore, the magnetic polarity of the third and fourth magnetic material layers 210 and 212 can be set as a result of magnetic fields generated locally by orthogonal electrical currents, such as the at least one write current $I_{WRT}$. Such magnetic polarity can affect the magnitude of the critical current of the HMJJ 200, as described previously. Accordingly, the binary value can be stored in the HMJJ 200 based on the magnetic polarity of the third and fourth magnetic material layers 210 and 212.

The HMJJ 200 further includes a first polarizing layer 216 that interconnects the first superconducting electrode layer 202 and the third magnetic layer 210 and a second polarizing layer 218 that interconnects the second superconducting electrode layer 204 and the second magnetic layer 208. In the example of FIG. 5, the first and second polarizing layers 216 and 218 are demonstrated as "X". The first and second polarizing layers 216 and 218 can be formed from a ferromagnetic material or alloy with magnetization lying in a plane of the device or perpendicular to the device, similar to as described previously in the example of FIG. 2. As another example, the first and second polarizing layers 216 and 218 can be formed from magnetic materials having a conical magnetization, such as holmium (Ho), or can be arranged as surface-pinned domain walls. The first and second polarizing layers 216 and 218 can have a magnetic polarity that is substantially orthogonal with respect to the magnetic polarity associated with the magnetic layers 206, 208, 210, and 212, or otherwise provide a magnetization having an orientation that is inhomogeneous throughout the first and second polarizing layers 216 and 218. Accordingly, the first and second polarizing layers 216 and 218 can be configured to convert the superconducting Cooper pairs associated with the tunneling current (i.e., the read current $I_{RD}$) from the singlet-state to the triplet-state. In the example of FIG. 5, the first and second polarizing layers are fixed magnetic material layers.

As described above, superconducting Cooper pairs that are in a triplet-state can be essentially spin-polarized. As a result, the triplet-tunneling matrix element across the tunnel barrier 214 can be sensitive to a relative alignment of the first and fourth magnetic layers 206 and 212. This can be akin to the tunneling magnetoresistive (TMR) effect that is used in MRAM devices. However, in the case of the HMJJ 200, it is the magnitude of the Josephson critical current that is affected by the relative alignment of magnetic layers 206 and 212 rather than the resistance of the Josephson junction. This effect is absent in the tunneling of singlet-state superconducting Cooper pairs, and is enabled in HMJJ 200 by the incorporation of the polarizing layers 216 and 218.

Figure 6:
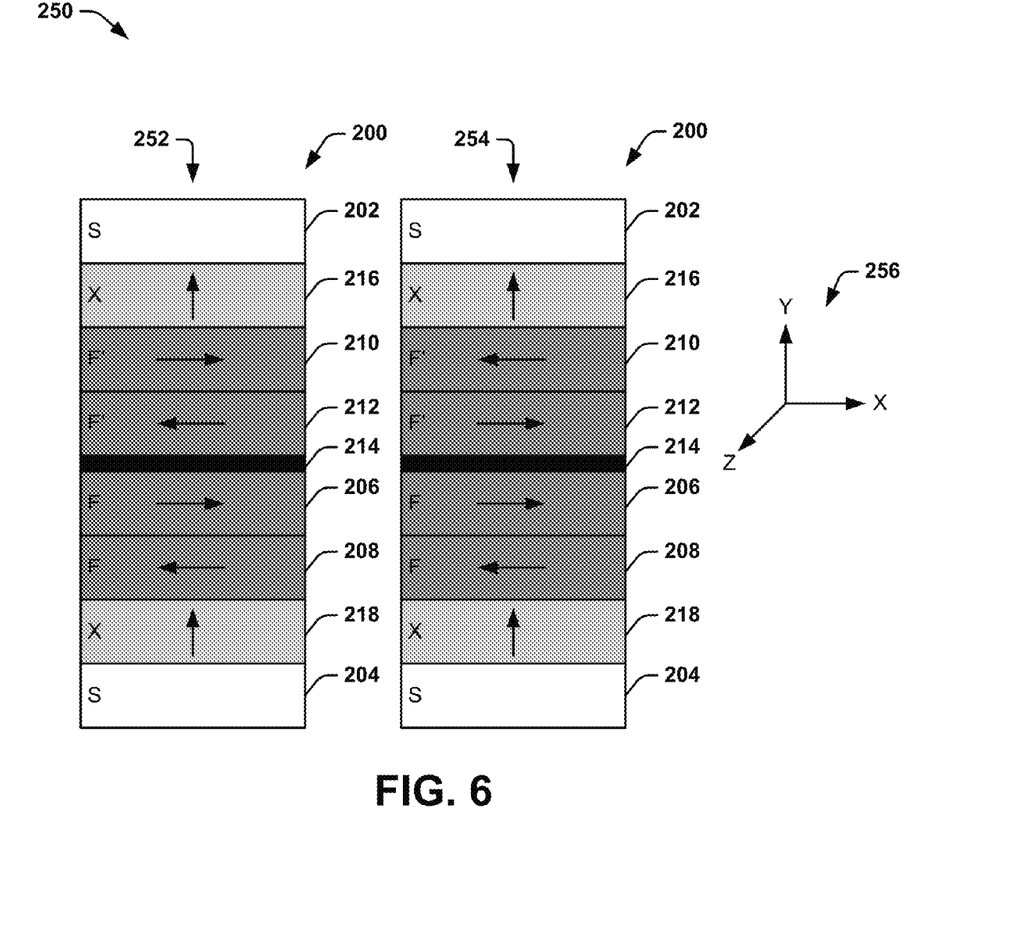
FIG. 6 illustrates yet another example of a diagram of two states of an HMJJ in accordance with an aspect of the invention

FIG. 6 illustrates an example of a diagram 250 of two states of the HMJJ 200 in accordance with an aspect of the invention. The diagram 250 includes a first state 252 corresponding to a first logic-state of the binary value stored in the HMJJ 200 and a second state 254 corresponding to a second logic-state of the binary value stored in the HMJJ 200. It is to be understood that the specific logic-states associated with the first and second states 252 and 254 can be arbitrary depending on the associated readout system. The diagram 250 demonstrates magnetic polarities in the magnetic layers 206, 208, 210, 212, 216, and 218 based on a Cartesian coordinate system 256.

In the first state 252, the first magnetic layer 206 has a first magnetic polarity in the +X direction and the second magnetic layer 208 has a second magnetic polarity in the −X direction, and which is thus substantially anti-parallel with respect to the first magnetic polarity. In addition, the third magnetic layer 210 has the first magnetic polarity and the fourth magnetic layer 212 likewise has the second magnetic polarity, thus forming a substantially anti-parallel alignment of the fourth magnetic layer 212 and the first magnetic layer 206 on the opposite sides of the tunnel barrier 214. Furthermore, the first polarizing layer 216 and the second polarizing layer 218 have magnetic polarities in the +Y direction, and which are thus parallel with respect to each other and substantially orthogonal to the first and second magnetic polarities. It is to be understood that, while the magnetic polarities of the first and second polarizing layers 216 and 218 are demonstrated in the +Y direction, it is to be understood that the polarities of the first and second polarizing layers 216 and 218 could instead both be in the −Y direction, the +Z direction, or the −Z direction, such that they are substantially orthogonal to the first and second magnetic polarities. In addition, as stated previously, the polarizing layers 216 and 218 may have a conical magnetization or otherwise affect an inhomogeneous magnetization that results in a conversion of a significant portion of the tunneling current to a triplet-state.

In the second state 254, the magnetic polarities of the first and second magnetic layers 206 and 208 and the first and second polarizing layers 216 and 218 remain the same based on the first and second magnetic layers 206 and 208 and the first and second polarizing layers 216 and 218 being formed as fixed magnet material layers. However, in the second state 254, the third and fourth magnetic layers 210 and 212 have a magnetic polarity in the −X direction and +X direction, respectively, thus forming a substantially parallel alignment of the fourth magnetic layer 212 and the first magnetic layer 206 on the opposite sides of the tunnel barrier 214. Therefore, in the second state 254, the magnetic polarities of the third and fourth magnetic layers 210 and 212 are set to the opposite orientation as that in the first state 252 based on at least one write current (e.g., the write current $I_{WRT}$) to change the critical current of the HMJJ 200 based on a TMR effect experienced by the spin-polarized triplet-state electrons of the read current $I_{RD}$. Accordingly, the magnetic polarity of the third and fourth magnetic layers 210 and 212 can dictate the binary value that is stored in the HMJJ 200.

Figure 7:
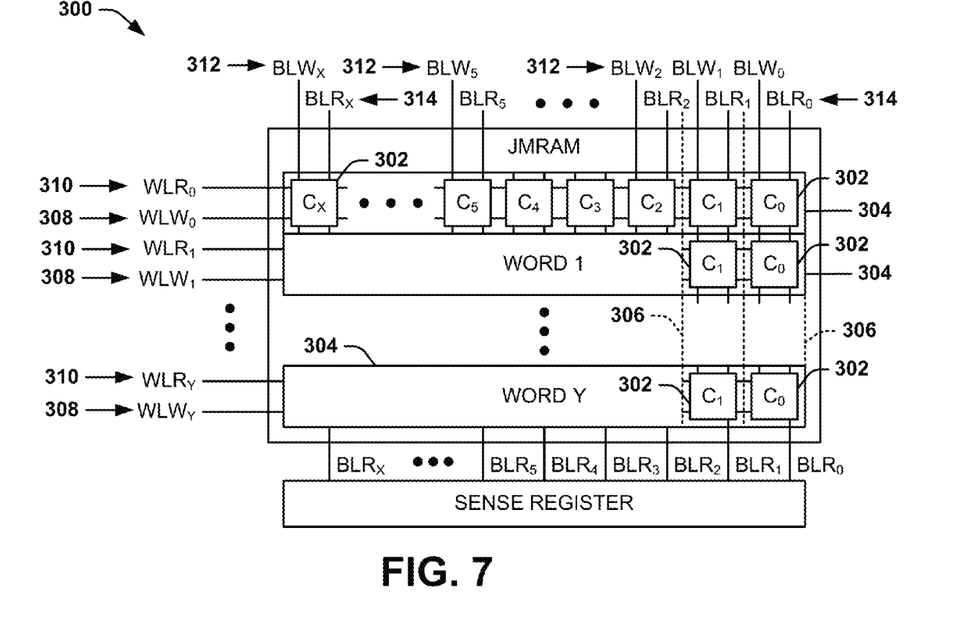
FIG. 7 illustrates an example of a Josephson magnetic random access memory (JMRAM) system in accordance with an aspect of the invention.

FIG. 7 illustrates an example of a Josephson magnetic random access memory (JMRAM) system 300 in accordance with an aspect of the invention. The JMRAM system 300 can be implemented as a memory structure in a variety of quantum and/or classical computing applications. As an example, the JMRAM system 300 can be configured cryogenically in a quantum computing circuit, such as operating at approximately 4 Kelvin or less, to store classical data and/or controller instructions in a quantum computing environment.

The JMRAM system 300 is demonstrated in the example of FIG. 7 as being arranged as an array of memory cells 302. Specifically, the memory cells 302 are arranged in rows 304 that each correspond to a data word, demonstrated as WORD 0 through WORD Y, where Y is an integer greater than 1. Each of the rows 304 includes a set of memory cells 302 that form X columns 306 across the rows 304, with the memory cells 302 in WORD 0 being demonstrated in the example of FIG. 7 as $C_0$ to $C_X$, where X is an integer greater than 1. Therefore, each of the memory cells 302 in the array of the JMRAM system 300 can be individually addressable by row 304 and column 306.

In the example of FIG. 7, each of the rows 304 is demonstrated as having an associated word-write line 308 and word-read line 310, demonstrated as $WLW_0$ and $WLR_0$ through $WLW_Y$ and $WLR_Y$, respectively. The word-write line 308 and word-read line 310 can be inductively and/or magnetically coupled to each of the memory cells 302 in each of the rows 304 of the JMRAM system 300. In addition, each of the memory cells 302 is demonstrated as having an associated bit-write line 312 and bit-read line 314, demonstrated as BLW$_0$ and BLR$_0$ through BLW$_Y$ and BLR$_Y$, respectively. The bit-write line 312 and bit-read line 314 can be coupled to each corresponding numbered memory cell 302 in each of the rows 304 of the JMRAM system 300, such that the memory cells 302 in each column 306 are arranged in series with respect to the bit-write line 312 and bit-read line 314.

Each of the memory cells 302 is configured to store a single bit of data. Specifically, each of the memory cells 302 can be configured substantially similar to the memory cell 12 in the example of FIG. 1. Specifically, each of the memory cells 302 can include an HMJJ, such as similar to the HMJJ 50 or 200 in the examples of FIGS. 2 and 5, respectively, that can be configured to store the binary value corresponding to a binary logic-1 or a binary logic-0. The binary value can be set in response to a word-write current that is provided on the respective word-write line 308 and a bit-write current that is provided on the respective bit-write line 312, such as to change a magnetic polarity of at least one free magnetic material layer. Similarly, the respective digital state that is stored in each of the memory cells 302 can be read from the memory cells 302 based on a word-read current that is provided on the respective word-read line 310 to select a given one of the rows 304 and a bit-read current that is provided on the respective bit-read line 314. Specifically, the bit-read line 314 of each of the columns 306 is coupled to a sense register 316 that is configured to determine whether the binary value of each of the memory cells 302 of an associated row 304 corresponds to a binary logic-1 state or a binary logic-0 state in response to the word-read current and the bit-read current during a read operation. As an example, the sense register 316 can measure a voltage or a current associated with the bit-read line 314, or a magnetic flux in each of the respective memory cells 302, as described in the example of FIG. 1.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A Josephson magnetic memory cell system comprising:
   at least one superconducting electrode configured to conduct a read current;
   at least one hysteretic magnetic Josephson junction (HMJJ), wherein at least one of the at least one HMJJ is configured to store a binary value and to convert superconducting pairs associated with the read current flowing through the at least one HMJJ from a singlet-state to a triplet-state;
   a write circuit magnetically coupled to the at least one of the at least one HMJJ and configured to write the binary value into the at least one of the at least one HMJJ in response to at least one write current; and
   a read circuit configured to determine the binary value stored in the at least one of the at least one HMJJ in response to application of the read current to the at least one of the at least one HMJJ.

2. The system of claim 1, further comprising a second Josephson junction arranged in parallel with the at least one of the at least one HMJJ and configured to conduct at least a portion of the read current, a magnetic flux in between the at least one of the at least one HMJJ and the second Josephson junction in response to the read current being indicative of the binary value stored in the at least one of the at least one HMJJ.

3. The system of claim 1, wherein the at least one of the at least one HMJJ comprises at least one first magnetic material layer having a fixed magnetization and at least one second magnetic material layer having a free magnetization corresponding to a bi-stable orientation, wherein at least one of the at least one first magnetic material layer and the at least one second magnetic material layer has a magnetic polarity that is substantially orthogonal with respect to remaining magnetic material layers.

4. The system of claim 1, wherein each of the at least one second magnetic material layer interconnects each of the at least one superconducting electrode and each of the at least one first magnetic material layer.

5. The system of claim 1, wherein the at least one of the at least one HMJJ comprises:
   a first fixed magnetic material layer having a first magnetic polarity;
   a second fixed magnetic material layer having a second magnetic polarity that is anti-parallel with the first magnetic polarity;
   a third fixed magnetic material layer having a third magnetic polarity that is substantially orthogonal with respect to the first and second magnetic polarities;
   a free magnetic material layer having a variable magnetic polarity that is responsive to the at least one write current and which corresponds to the stored binary value.

6. The system of claim 5, wherein the variable magnetic polarity is set to the third magnetic polarity in response to the at least one write current to set the binary value to a first logic-state and is set to a fourth magnetic polarity that is substantially anti-parallel with the third magnetic polarity in response to the at least one write current to set the binary value to a second logic-state.

7. The system of claim 5, wherein the variable magnetic polarity is set to the first magnetic polarity in response to the at least one write current to set the binary value to a first logic-state and is set to a fourth magnetic polarity that is substantially anti-parallel with the third magnetic polarity in response to the at least one write current to set the binary value to a second logic-state.

8. The system of claim 1, wherein the at least one of the at least one HMJJ comprises:
   a first fixed magnetic material layer having a first magnetic polarity;
   a second fixed magnetic material layer having a second magnetic polarity that is anti-parallel with the first magnetic polarity;
   at least one third fixed magnetic material layer having a third magnetic polarity that is substantially orthogonal with respect to the first and second magnetic polarities;
   a first free magnetic material layer having a variable magnetic polarity that varies in response to the at least one write current between the first magnetic polarity in a first logic-state of the binary value and the second magnetic polarity in a second logic-state of the binary value; and
   a second free magnetic material layer having a variable magnetic polarity that varies in response to the at least one write current between the first magnetic polarity in the second logic-state of the binary value and the second magnetic polarity in the first logic-state of the binary value.

9. The system of claim 1, wherein the at least one of the at least one HMJJ is configured to convert the superconducting pairs associated with the read current flowing through the at least one of the at least one HMJJ between the singlet-state in a first logic-state of the binary value to a triplet-state in the second logic-state of the binary value based on a magnetic polarity of at least one free magnetic material layer having a bi-stable orientation responsive to the at least one write current.

10. A Josephson magnetic random access memory (JM-RAM) comprising a plurality of the Josephson magnetic memory cell systems of claim 1 arranged as an array of rows and columns, each of the Josephson magnetic memory cell systems being configured to store the respective binary value in response to a word-write current that is provided on a word-write line and a bit-write current that is provided on a bit-write line, and being further configured to output the respective binary value in response to a word-read current that is provided on a word-read line and a bit-read current that is provided on a bit-read line.

11. A Josephson magnetic memory cell system comprising:
at least one superconducting electrode configured to conduct a read current;
a hysteretic magnetic Josephson junction (HMJJ) comprising at least one first magnetic material layer having a fixed magnetization and at least one second magnetic material layer having a free magnetization corresponding to a bi-stable orientation, wherein at least one of the at least one first magnetic material layer and the at least one second magnetic material layer has a substantially orthogonal magnetic polarity with respect to remaining magnetic material layers, the HMJJ being configured to store a binary value based on the magnetic polarity of at least one of the at least one first and the at least one second magnetic material layers;
a write circuit magnetically coupled to the HMJJ and configured to write the binary value into the HMJJ in response to at least one write current; and
a read circuit configured to determine the binary value stored in the HMJJ in response to application of the read current to the HMJJ.

12. The system of claim 11, further comprising a second Josephson junction arranged in parallel with the HMJJ and configured to conduct at least a portion of the read current, a magnetic flux in between the HMJJ and the second Josephson junction in response to the read current being indicative of the binary value stored in the HMJJ.

13. The system of claim 11, wherein the HMJJ is configured to convert superconducting pairs associated with the read current flowing through the HMJJ from a singlet-state to a triplet-state based on the substantially orthogonal magnetic polarity associated with the at least one second magnetic material.

14. The system of claim 13, wherein the HMJJ is configured to convert the superconducting pairs associated with the read current flowing through the HMJJ between the singlet-state in a first logic-state of the binary value to the triplet-state in a second logic-state of the binary value based on the magnetic polarity of at least one of the at least one first and the at least one second magnetic material layers.

15. The system of claim 11, wherein the HMJJ comprises:
a first fixed magnetic material layer having a first magnetic polarity;
a second fixed magnetic material layer having a second magnetic polarity that is anti-parallel with the first magnetic polarity;
a third fixed magnetic material layer having a third magnetic polarity that is substantially orthogonal with respect to the first and second magnetic polarities;
a free magnetic material layer having a variable magnetic polarity that is responsive to the at least one write current and which corresponds to the stored binary value.

16. The system of claim 11, wherein the HMJJ comprises:
a first fixed magnetic material layer having a first magnetic polarity;
a second fixed magnetic material layer having a second magnetic polarity that is anti-parallel with the first magnetic polarity;
at least one third fixed magnetic material layer having a third magnetic polarity that is substantially orthogonal with respect to the first and second magnetic polarities;
a first free magnetic material layer having a variable magnetic polarity that varies in response to the at least one write current between the first magnetic polarity in a first logic-state of the binary value and the second magnetic polarity in a second logic-state of the binary value; and
a second free magnetic material layer having a variable magnetic polarity that varies in response to the at least one write current between the first magnetic polarity in the second logic-state of the binary value and the second magnetic polarity in the first logic-state of the binary value.

17. A Josephson magnetic random access memory (JM-RAM) comprising a plurality of Josephson magnetic memory cell systems arranged as an array of rows and columns, each of the Josephson magnetic memory cell systems comprising a hysteretic magnetic Josephson junction (HMJJ) comprising at least one first magnetic material layer having a fixed magnetization and at least one second magnetic material layer having a free magnetization corresponding to a bi-stable orientation, wherein at least one of the at least one first magnetic material layer and the at least one second magnetic material layer has a substantially orthogonal magnetic polarity with respect to remaining magnetic material layers to convert superconducting pairs associated with the read current flowing through the HMJJ from a singlet-state to a triplet-state in the respective HMJJ, and being configured to store a respective binary value in response to a word-write current that is provided on a word-write line and a bit-write current that is provided on a bit-write line to adjust the magnetic polarity of at least one of the at least one second magnetic material layer, and being further configured to output the respective binary value in response to a word-read current that is provided on a word-read line and a bit-read current that is provided on a bit-read line.

18. The JMRAM of claim 17, wherein each of the plurality of Josephson magnetic memory cell systems further comprises a second Josephson junction arranged in parallel with the HMJJ and configured to conduct at least a portion of the read current, a magnetic flux in between the HMJJ and the second Josephson junction in response to the read current being indicative of the binary value stored in the HMJJ.

19. The JMRAM of claim 17, wherein the HMJJ in each of the plurality of Josephson magnetic memory cell systems is configured to convert the superconducting pairs associated with the bit-read current flowing through the HMJJ between the singlet-state in a first logic-state of the binary value to the triplet-state in a second logic-state of the binary value based on the magnetic polarity of at least one of the at least one first and the at least one second magnetic material layers.

20. The JMRAM of claim 17, wherein the word-write current and the bit-write current are collectively configured to set the substantially orthogonal magnetic polarity of the at least one second magnetic material layer to a first polarity for a first logic-state of the binary value and to a second polarity that is substantially anti-parallel to the first polarity for a second logic-state of the binary value.

* * * * *